United States Patent [19]

Lumbard

[11] Patent Number: 4,859,632

[45] Date of Patent: Aug. 22, 1989

[54] METHOD FOR MANUFACTURING THE SAME

[75] Inventor: Marvin Lumbard, Los Gatos, Calif.

[73] Assignee: Siemens Corporate Research and Support, Inc., Iselin, N.J.

[21] Appl. No.: 138,887

[22] Filed: Dec. 28, 1987

[51] Int. Cl.[4] .............................................. H01L 21/60
[52] U.S. Cl. .................................. 437/209; 437/206; 437/220; 206/330; 375/70; 264/272.11; 29/841
[58] Field of Search ............... 437/209, 211, 206, 217, 437/220, 219; 206/330; 375/70; 264/272.11; 29/841

[56] References Cited

U.S. PATENT DOCUMENTS

| 3,385,426 | 5/1968  | May et al. ............................. 206/330 |
| 3,444,440 | 5/1969  | Bell et al. . |
| 3,611,061 | 10/1971 | Segerson . |
| 3,689,991 | 9/1972  | Aird . |
| 3,838,984 | 10/1974 | Crane et al. . |
| 3,864,820 | 2/1975  | Brenan et al. ........................ 437/219 |
| 4,132,856 | 1/1979  | Hutchison et al. . |
| 4,214,364 | 7/1980  | St. Louis et al. ..................... 29/827 |
| 4,282,544 | 8/1981  | Nowak .................................. 357/72 |
| 4,301,464 | 11/1981 | Otsuki et al. ......................... 357/70 |
| 4,305,204 | 12/1981 | Toggart et al. ....................... 29/841 |
| 4,380,042 | 4/1983  | Angelucci, Sr. et al. . |
| 4,413,404 | 11/1983 | Burns .................................... 437/206 |
| 4,477,827 | 10/1984 | Walker et al. ........................ 357/70 |
| 4,480,150 | 10/1984 | Jones et al. .......................... 206/330 |
| 4,689,875 | 9/1987  | Solstad ................................. 437/211 |
| 4,701,781 | 10/1987 | Sankhagowit ......................... 357/70 |

FOREIGN PATENT DOCUMENTS

| 0039866 | 4/1978 | Japan ................................... 437/220 |
| 0088350 | 7/1980 | Japan ................................... 437/220 |
| 0212031 | 9/1986 | Japan ................................... 437/220 |

Primary Examiner—Brian E. Hearn
Assistant Examiner—Beverly A. Pawlikowski
Attorney, Agent, or Firm—John F. Moran

[57] ABSTRACT

A lead frame and method for processing the lead frames from a continuous strip of lead frames. A first insulation support member and a second insulative support member are first molded to the lead frame. After the support members are formed, the positioning member for supporting the leads within the lead frame is stamped from the lead frame. After an integrated circuit (IC) is connected to the leads, the IC can be tested within the lead frame since the leads are electrically isolated from the lead frame and each other. Finally the IC can be encapsulated and the leads severed from the lead frame assembly.

12 Claims, 4 Drawing Sheets

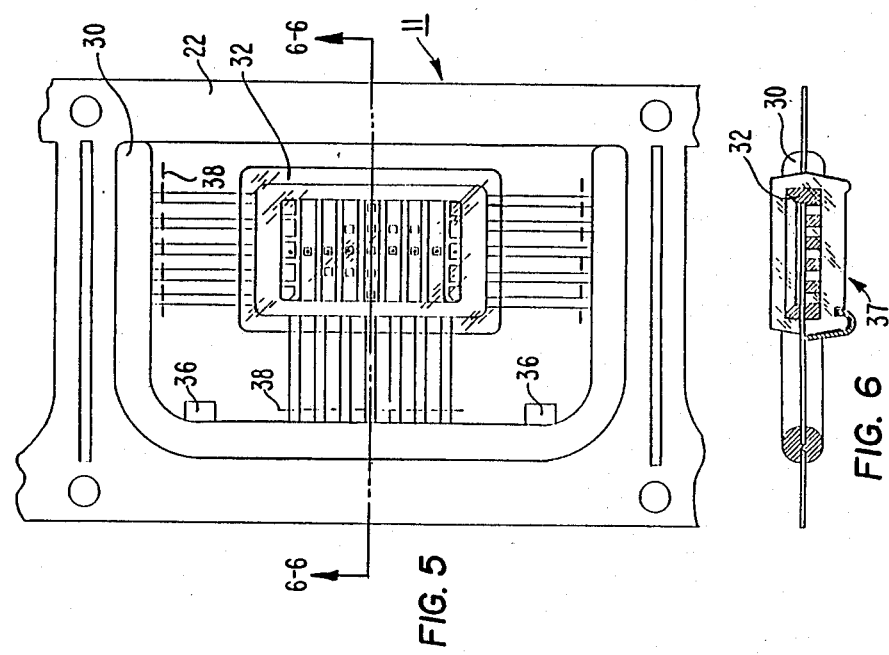
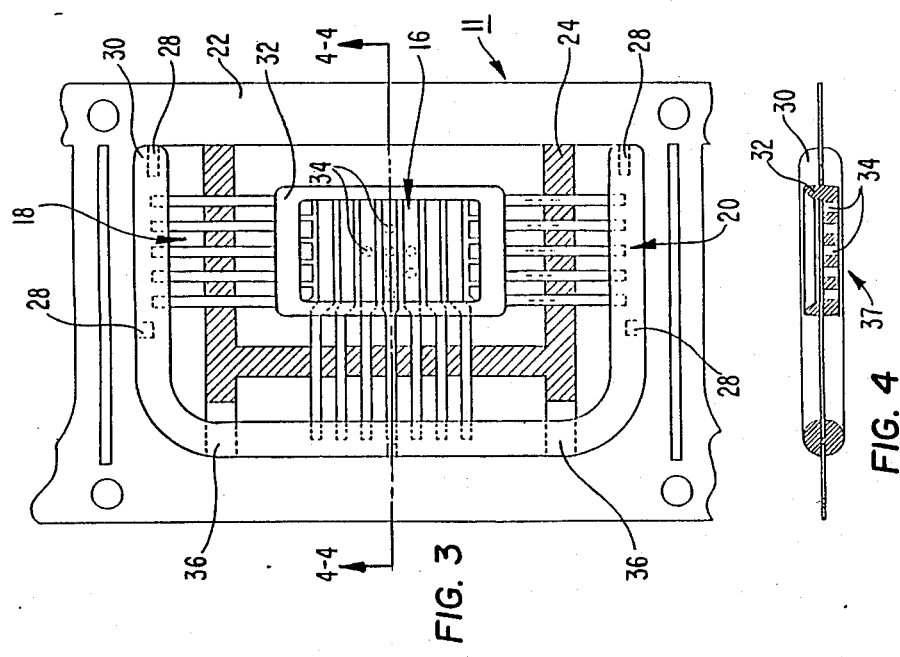

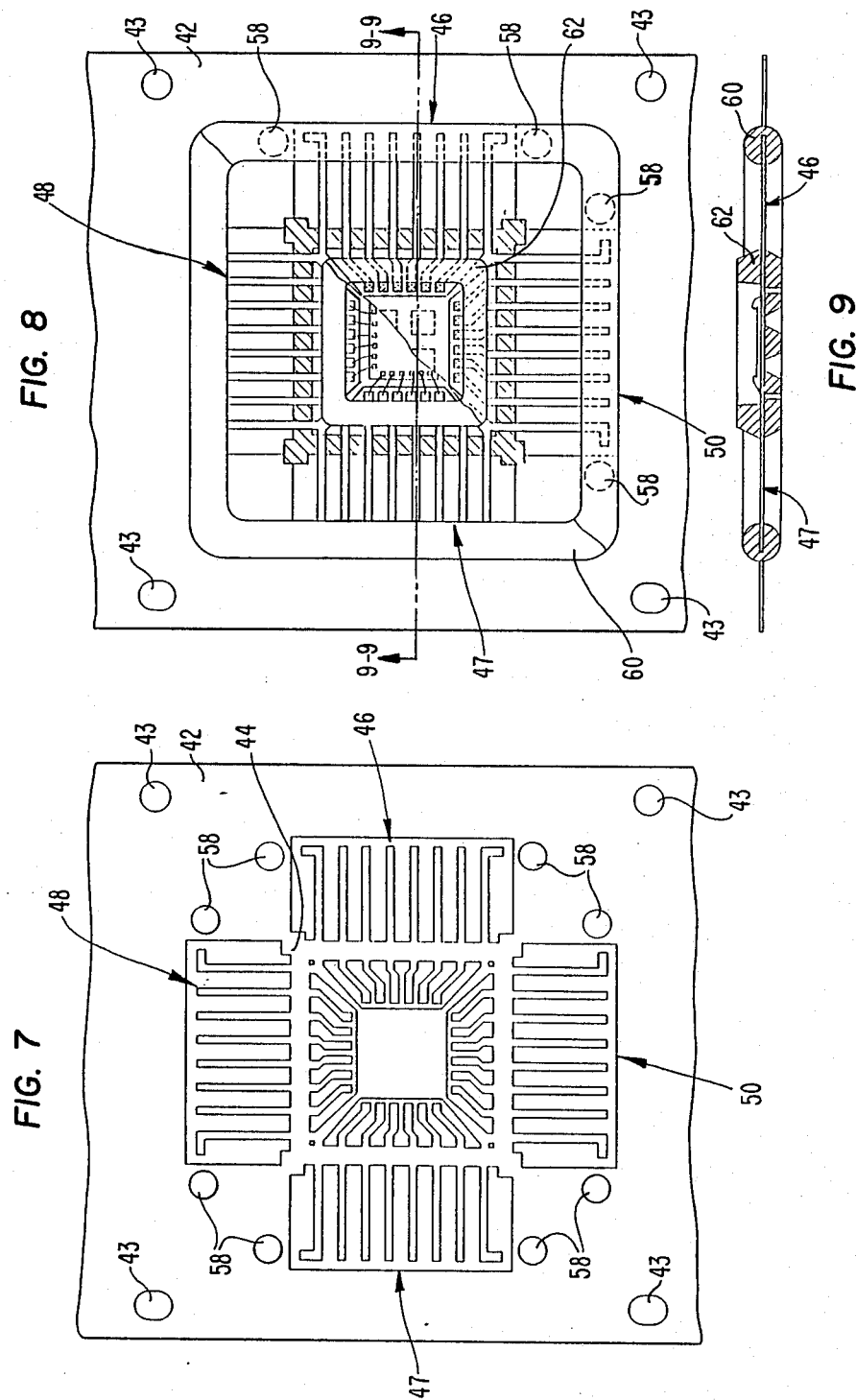

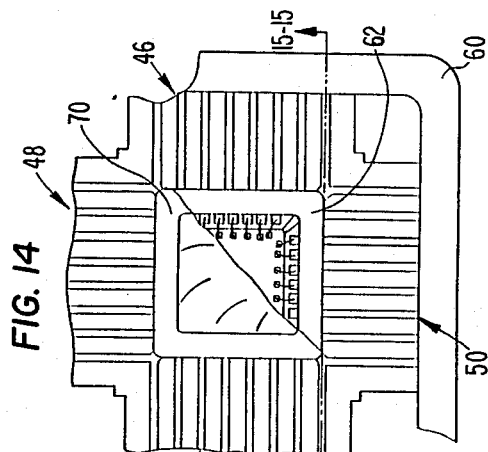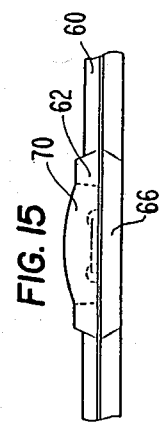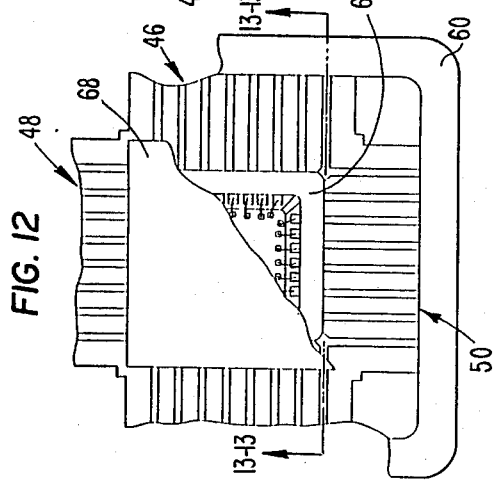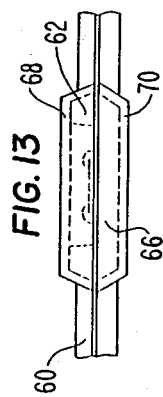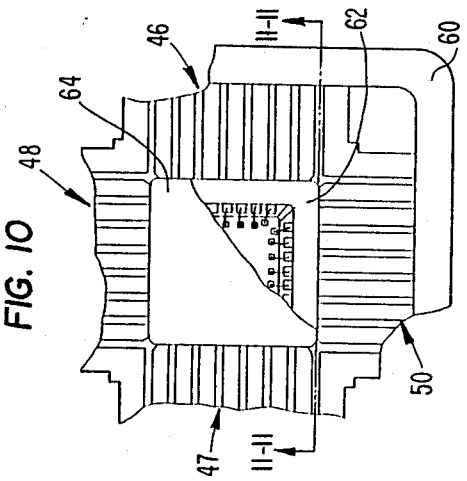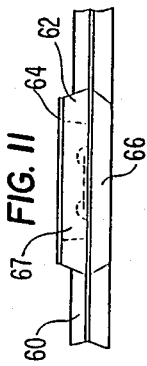

METHOD FOR MANUFACTURING THE SAME

BACKGROUND OF THE INVENTION

This invention relates to a lead frame and lead frame processing techniques for leaded semiconductor chip carriers. More particularly, the invention relates to a lead frame design and method that enables a complete and thorough testing of an assembled product in a totally non-destructive manner prior to encapsulation.

In the equipment used to produce semiconductor packages, the chips are mounted on a die pad, and connections are made from the contact areas of the die pad to similar areas in the package or the chips in the package. The external connections of the package take the form of leads which attach to the printed circuit board (PCB). The use of a surface mount technique allows the package to be small in size which in turn conserves space on the PCB.

Present manufacturing processes typically handle lead frame assemblies in strip form wherein linked lead frames each have at least one chip position. The linked lead frames are wound on reels to provide a continuous strip on which various automated steps or manufacturing processes may be performed to provide an assembled leaded semiconductor package. Such packages are either of the hermetic type or the non-hermetic type (plastic packaging) used primarily in commercial applications. For example, U.S. Pat. No. 4,214,364 provides for the hermetic and non-hermetic packaging of passive and active electrical and electronic devices, and is particularly suitable for semiconductor devices, using a common lead frame in strip form.

A major drawback of current products and packaging techniques is the inability of testing, an assembled, packages prior to encapsulation. After encapsulation it is not economically practical to open up a package to rework a chip or connection therein. In the case of molded packages, undoing the encapsulation is simply not practical. Therefore, the production yield of packaged semiconductor circuits is lowered due to the inability to rework defective assemblies. In packages containing a number of chips, the opportunity for mistakes increases with the increased number of chips and operations performed thereon. Accordingly, foregoing the opportunity to rework a chip or package is a disadvantage in terms of both relative yield itself and the absolute cost of the investment associated with the more complex chip assemblies.

One significant application of complex chip assemblies is in the case of display packages wherein a large number of devices are used in array fashion for display matrices. In general, and particularly in the latter situation, it would be highly advantageous and economically beneficial to be able to test the assembled package while still in the lead frame strips so that defective assemblies may be reworked prior to encapsulation. Such testing also should be done in a manner such that damage to the package and tiny leads of highly ductile material is reduced or eliminated.

SUMMARY OF THE INVENTION

It is a feature of the invention to have a lead frame assembly wherein the leads of the individual lead frames are electrically isolated from the lead frame strip while at the same time being mechanically supported by the lead frame strip. The mechanical support from the lead frame strip allows the lead frames to withstand conventional probing forces during testing to ensure reliable electrical connection without substantial deformation of the individual leads.

It is an object of the invention to utilize injection molding techniques for providing mechanical support at both ends of each tiny lead to withstand the physical contact of conventional probes.

It is a further object of the invention to provide the lead frame assemblies with insulative support members and subsequently remove supporting metallic structures such that the leads of the lead frame are electrically isolated.

It is a further object to provide the attendant features and advantages of the invention using a minimum number of operations so that the full economic benefit of reworking is realized consistent with current manufacturing processes whose major attributes are low cost packaging and assembly techniques.

The invention takes the form of a lead frame assembly and an associated process wherein mechanical support is present at the same time that electrical isolation is provided to enable continuous operation of repetitive testing in an automated processing environment. The assemblies which fail the test are then reworked to salvage them. These salvaged assemblies after successful retesting may then be encapsulated in the same manner as the assemblies which initially pass the testing operation.

Various other objects and advantages of the present invention will become apparent from the following description, with reference to the accompanying drawings.

BRIEF DESCRIPTION OF THE DRAWINGS

FIG. 3 illustrates the lead frame during a stage of processing;

FIG. 4 is a cross-sectional view taken through line 4—4;

FIG. 5 illustrates the lead frame during a stage of processing;

FIG. 6 is a cross-sectional view taken through line 6—6;

FIG. 7 illustrates a second type of lead frame;

FIG. 8 illustrates the lead frame during a stage of processing;

FIG. 9 is a cross-sectional view taken through line 9—9;

FIG. 10 illustrates a first type of encapsulation for an IC;

FIG. 11 is a cross-sectional view taken along line 11—11;

FIG. 12 illustrates a second type of encapsulation for an IC;

FIG. 13 is a cross-sectional view taken along line 13—13;

FIG. 14 illustrates a third type of encapsulation for an IC; and

FIG. 15 is a cross-sectional view taken along line 15—15.

DETAILED DESCRIPTION

Figure 1:
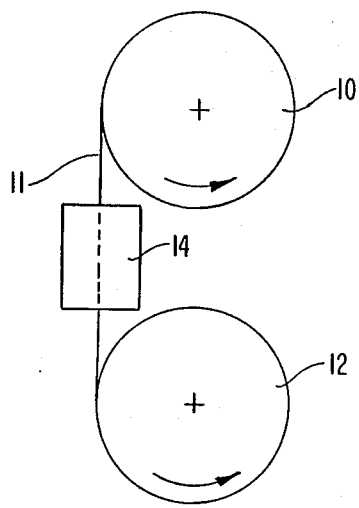
FIG. 1 illustrates a schematic of a lead frame strip processing assembly.

FIG. 1 generally represents the present status of techniques used in the processing of semiconductor package assemblies. Basically, a metal lead frame strip 11 in the form of a continuous, stamped lead frame is wound from a first reel 10 onto a second reel 12. The first reel 10 is rotated in the counter-clock-wise direction to act as a lead frame source for processing. As a typical processing step, injection molding occurs at a molding station 14 to form a package on the lead frames of strip 11. The strip 11 is passed through the molding station 14 and incremented forward in steps. During each machine cycle, a section of strip 11 enters the molding station 14 and plastic is attached to it by injection molding. During the injection molding process, one or more lead frames can be operated on concurrently. The second reel 12 serves as a take up reel by also rotating in the counter-clock-wise direction.

Figure 2:
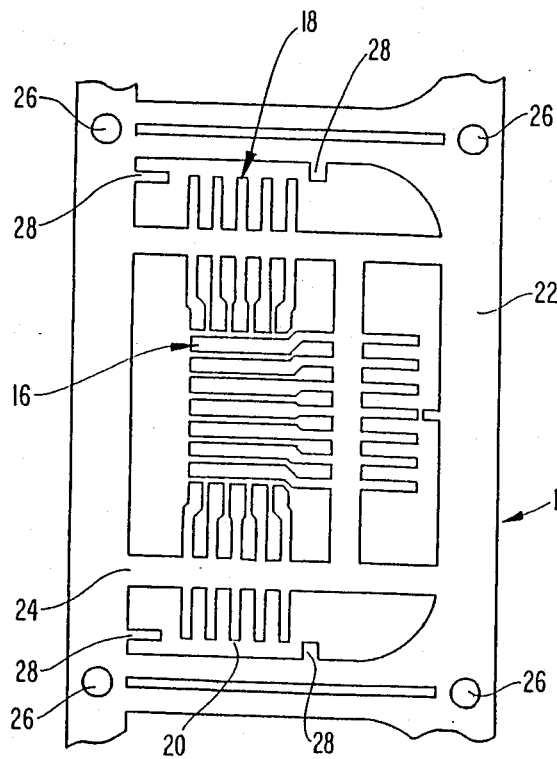
FIG. 2 illustrates a first type of lead frame.

FIG. 2 illustrates a section of a continuous stamped lead frame strip 11. The lead frame strip is preferrably made of a ductile and conductive metal. For example, a suitable metal is the copper alloy known as OLIN 151. For purposes of aluminum ultrasonic wire bonding, the metal is gold plated in selected areas.

The lead frame includes a support section-22, a positioning member 24, a first plurality of horizontal leads 16, a first plurality of vertical leads 18 and a second plurality of vertical leads 20. The support section 22, leads 16, 18, 20 and positioning member 24 are integrally formed as part of the lead frame. The support section 22 includes positioning holes 26 and support tabs 28. The outer end portions of the leads 16, 18, 20 form the external leads of the IC Packages to be manufactured in accordance with the process.

FIGS. 3–6 illustrate a lead frame wherein a U-shaped plastic member 30 serves as an insulative member between the leads 16, 18, 20 and the support section 22. A molding step provides the plastic member 30. The plastic member 30 is molded to the leads 16, 18, 20 such that it cooperates with the support section 22, the support tabs 28, the end portions 36 of the positioning member 24 and the ends of the leads 16, 18, 20. This cooperation serves to support the leads 16, 18, 20 within the support section 22 of the lead frame while also electrically insulating the leads 16, 18, 20 from the lead frame.

The molding step also produces a rectangular plastic isolation ring and/or platform base member 32 which serves as a mechanical support and insulative member between the leads 16, 18, 20. The plastic member 32 is molded to the leads 16, 18, 20 such that the leads 16, 18, 20 maintain their physical position with respect to each other while also being electrically insulated from each other. The plastic member 32 also serves to form a portion of the semiconductor IC package. FIGS. 3 and 4 also illustrate a number of molded cavities 34 (shown partially for the sake of clarity) which serve to prevent flashing of the molded material onto portions of the fingers 16.

By way of example, a suitable material for the members 30, 32 is a polyetherimide. Such a material is available from the General Electric Company and is known as ULTEM 1000.

After the members 30, 32 are molded to the lead frame the positioning member 24 is punched away from the leads 16, 18, 20 and the support frame 22. In FIG. 3 the punched out portion of the positioning member 24 is illustrated with cross-hatching. Subsequently, the devices or circuits in chip form may be die-attached to the base and wire bonded to the electrical leads.

Before any further packaging, while the lead frame is still in strip form, the entire circuit is tested by applying operating voltages to the electrical leads 16, 18, 20. Such testing is made possible and convenient by using this arrangement since the leads 16, 18, 20 are electrically isolated from the support section 22 via the member 30 and from each other via the member 32. The mechanical support provided by the members 30, 32 enables contact probes to press against the leads at any point during the testing operation without deforming the highly ductile metal of the lead frames.

The circuits, after testing and reworking, are ready for encapsulation into a package as an assembly. This may be done by transfer molding. In the case of display chips or optical driver chips (optoisolaters), the encapsulation material would be clear or transparent thermoset plastic material such as that depicted in FIGS. 5, 6. In other situations, an opaque thermoset plastic material may be used. This type of packaging arrangement is, therefore, suitable for a variety of applications wherein various integrated circuit and device chips are employed.

The dotted lines 38 in FIG. 5 indicate the lines along which the leads 16, 18, 20 are severed. After the severing operation, the leads are bent in a J-shape under the package as shown in FIG. 6. This arrangement provides a highly convenient bonding area on the bottom portion of the package for surface mounting onto a printed circuit board.

FIGS. 7–15 illustrate another type of lead frame with which the above-described process can be used. This lead frame includes a support section 42, a positioning member 44, a first plurality of horizontal leads 46, a second plurality of horizontal leads 47, a first plurality of vertical leads 48 and a second plurality of vertical leads 50. The support section 42, leads 46, 47, 48, 50 and positioning member 54 are integrally formed as part of the lead frame. The support section 42 includes positioning holes 43 and support holes 58. The outer end portions of the leads 46, 47, 48, 50 form the external leads of the IC packages to be manufactured in accordance with the process.

In this type of lead frame a rectangular isolation ring 60 serves as an insulative member between the leads 46, 47, 48, 50 and the support section 42. A molding step provides the plastic member 60. The plastic member 60 is molded to the leads 46, 47, 48, 50 such that it cooperates with the support section 42, the support holes 58 and the ends of the leads 46, 47, 48, 50. This cooperation serves to support the leads within the support section 42 of the lead frame while also electrically insulating the leads 46, 47, 48, 50 from the lead frame.

The molding step also produces a rectangular plastic isolation ring and/or platform base member 62 which serves as an insulative member between the leads 46, 47, 48, 50. The plastic member 62 is also molded to the leads 46, 47, 48, 50 such that the leads 46, 47, 48, 50 maintain their physical position with respect to each other while also being electrically insulated from each other. This plastic member 62 also serves to form a portion of the semiconductor IC package.

After the members 60, 62 are molded to the lead frame the positioning member 44 is punched away from the leads 46, 47, 48, 50 and the support frame 42. In FIG. 8 the punched out portion of the positioning member 44 is illustrated by a cross-hatched area. Subsequently, the ICs are die attached, tested and encapsulated as described for the first configuration of the lead frame.

FIGS. 10–15 illustrate different forms of IC encapsulation. FIGS. 10 and 11 illustrate the plastic member 62, a lid 64 and a base 66 cooperating to form an encapsulating structure about the IC. The vacancy 67 within the structure can be air filled or packed with silicon. FIGS. 12 and 13 illustrate another type of encapsulation wherein a top cover 68 and a bottom cover 70 are formed such that they encapsulate the IC, the plastic member 62, and the base 66. FIGS. 14 and 15 illustrate still another type of encapsulation wherein a filler material 70 cooperates with the plastic member 62 and the base 66 to encapsulate the IC.

While two embodiments of the invention and several modifications thereof have been shown and described, various other changes and modifications may be made without departing from the scope of the invention. For example, the shape of the insulative member could be changed such that the insulative members are suitable for different lead frame configurations.

I claim:

1. A method for processing the lead frames of a lead frame strip, wherein the lead frames provide the leads for an integrated circuit, comprising:
    providing a lead frame strip defining at least one lead frame, wherein the lead frame defines a support section and a plurality of leads attached to a positioning member, the positioning member being attached to the support section;
    attaching the integrated circuit to the leads;
    providing a first insulative member for connecting the leads to the support section;
    providing a second insulative member for interconnecting the leads; and
    removing the positioning member such that the insulative members, support section and leads cooperate so that the leads are supported by the support section while being electrically insulated from the support section and electrically insulated from each other.

2. The method of claim 1 further comprising the step of testing the integrated circuit.

3. The method of claim 2 further comprising encapsulating the integrated circuit and severing the leads from the lead frame.

4. The method of claim 2 wherein the first insulative member is molded such that it forms a molded substantially U-shaped plastic member.

5. The method of claim 4 wherein the second insulative member is molded such that it forms a molded substantially rectangular plastic member.

6. The method of claim 2 wherein the first insulative member is molded such that it forms a molded substantially rectangular plastic member.

7. The method of claim 6 wherein the second insulative member is molded such that it forms a molded substantially rectangular plastic member.

8. A method for processing the lead frames of a lead frame strip, wherein the lead frames provide the leads for an integrated circuit, comprising:
    Providing a lead frame strip defining at least one lead frame, wherein the lead frame defines a support section and a plurality of leads attached to a positioning member, the positioning member being attached to the support section;
    providing a first plastic member for connecting the leads to the support section;
    providing a second plastic member for interconnecting the leads;
    removing the positioning member such that the insulative members, support section and leads cooperate so that the leads are supported by the support section while being electrically insulated from the support section and electrically insulated from each other;
    attaching the integrated circuit to the leads;
    testing the integrated circuit;
    encapsulating the integrated circuit after the integrated circuit is tested; and
    severing the leads from the lead frame after encapsulating the integrated circuit.

9. The method of claim 8 wherein the first plastic member is molded such that it forms a molded substantially U-shaped member.

10. The method of claim 9 wherein the second plastic member is molded such that it forms a molded substantially rectangular member.

11. The method of claim 12 wherein the first plastic member is molded such that it forms a molded substantially rectangular member.

12. The process of claim 11 wherein the second plastic member is molded such that it forms a molded substantially rectangular member.

* * * * *